United States Patent
Takizawa et al.

(10) Patent No.: US 6,486,553 B1
(45) Date of Patent: Nov. 26, 2002

(54) SEMICONDUCTOR DEVICE WITH INCREASED CONNECTION STRENGTH BETWEEN SOLDER BALLS AND WIRING LAYER

(75) Inventors: Tomoko Takizawa, Tokyo (JP); Masanori Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/521,680

(22) Filed: Mar. 9, 2000

(30) Foreign Application Priority Data

Mar. 9, 1999 (JP) .......................... 11-061912

(51) Int. Cl.[7] .................. H01L 23/48; H01L 23/52; H01L 29/40
(52) U.S. Cl. .................. 257/738; 257/737; 257/700
(58) Field of Search .................. 257/700, 738, 257/737

(56) References Cited

U.S. PATENT DOCUMENTS

| | | | |
|---|---|---|---|
| 4,840,302 A | 6/1989 | Gardner et al. | 410/1 G |
| 5,118,029 A * | 6/1992 | Fuse et al. | 228/198 |
| 5,162,257 A * | 11/1992 | Yung | 228/254 |
| 5,384,090 A | 1/1995 | Ogashiwa | 420/555 |
| 5,514,334 A | 5/1996 | Ogashiwa | 420/571 |
| 5,514,912 A | 5/1996 | Ogashiwa | 257/784 |
| 5,553,769 A | 9/1996 | Ellerson et al. | 228/123 |
| 5,668,058 A | 9/1997 | Tanioka et al. | 438/108 |
| 5,747,881 A | 5/1998 | Hosomi et al. | 257/762 |
| 5,821,627 A | 10/1998 | Mori et al. | 257/780 |
| 5,859,470 A | 1/1999 | Ellerson et al. | 257/772 |
| 5,902,686 A * | 5/1999 | Mis | 428/629 |
| 6,218,281 B1 | 4/2001 | Watanabe et al. | 438/612 |
| 6,232,212 B1 | 5/2001 | Degani et al. | 438/612 |
| 6,236,112 B1 * | 5/2001 | Horiuchi et al. | 257/734 |
| 6,265,300 B1 | 7/2001 | Bhansali et al. | 438/612 |
| 2001/0013652 A1 | 8/2001 | Hino et al. | 257/738 |
| 2001/0025723 A1 * | 10/2001 | Kondo et al. | 174/260 |

FOREIGN PATENT DOCUMENTS

| | | |
|---|---|---|
| JP | 04-280434 | 10/1992 |
| JP | 10-294394 | 11/1998 |

OTHER PUBLICATIONS

"Sub–0.25 um CMOS ULSI Technology with Multilevel Copper Interconnections", pp. 207–219.*

* cited by examiner

Primary Examiner—Phat X. Cao
(74) Attorney, Agent, or Firm—Katten, Muchin, Zavis, Rosenman

(57) ABSTRACT

There is provided a semiconductor device including (a) a semiconductor chip, (b) a wiring making. electrical connection with the semiconductor chip and containing copper (Cu) therein, (c) a solder ball making contact with the wiring and containing tin (Sn) therein, and (d) a layer made of copper-tin (Cu—Sn) alloy, sandwiched between the wiring and the solder ball, and having a thickness equal to or greater than about 1.87 micrometers. The copper-tin alloy layer strengthens connection between the wiring and the solder ball, and hence, ensures reduction in occurrence of breakage and/or cracking in the wiring and the solder ball. As a result, it would be possible to avoid the solder ball from being separated from the wiring due to the breakage and cracking. Accordingly, a fabrication yield of the semiconductor device can be enhanced.

20 Claims, 10 Drawing Sheets

FIG. 8H KEEPING DEVICE AT A TEMPERATURE OVER MELTING POINT OF SOLDER BALL

SEMICONDUCTOR DEVICE WITH INCREASED CONNECTION STRENGTH BETWEEN SOLDER BALLS AND WIRING LAYER

BACKGROUND OF THE INVENTION

Field of the Invention

The invention relates to a semiconductor device and a method of fabricating the same, and more particularly to enhancement of a fabrication yield of a semiconductor device.

DESCRIPTION OF THE RELATED ART

In response to requirement for an electronic device to accomplish higher performance, to be smaller in size and lighter in weight, and to be able to operate at a higher rate, many new semiconductor devices have been developed. For instance, an electronic device is formed smaller in size and lighter in weight by more highly integrating a semiconductor chip to thereby fabricate a semiconductor device in smaller size and weight.

FIGS. 1A to 1C illustrate a conventional semiconductor device. FIG. 1A is a cross-sectional view of a conventional semiconductor device, FIG. 1B is an enlarged view of a connection between a wiring layer and a solder ball, and FIG. 1C is a cross-sectional view illustrating that the semiconductor device illustrated in FIG. 1A is electrically connected to a printed wiring board.

With reference to FIG. 1A, the conventional semiconductor device is comprised of a semiconductor chip 1, a film substrate 3, a polyimide adhesive layer 31 adhering the film substrate 3 to the semiconductor chip 1, a resist 32 covering the wiring layer 2 therewith and formed with a land 7 which is a recess formed at a surface thereof, a wiring layer 2 formed on the film substrate 3, a solder ball 101 mounted on the wiring layer 2 in the land 7, a gold (Au) layer 8 covering the wiring layer 2 therewith within the land 7, a metal 5 filled in a through-hole 4 formed through both the film substrate 3 and the polyimide adhesive layer 31, and a gold (Au) layer 6 covering therewith the metal 5 at a top surface thereof The wiring layer 2 is in electrical connection with the semiconductor chip 1, and contains copper (Cu) therein. The solder ball 101 contains tin (Sn) therein. Though FIG. 1A explicitly illustrates the gold layer 8 formed on the wiring layer 2, it is considered that the gold layer 8 is diffused into the solder ball 101 in a heating step such as a temperature cycle test to be carried out after completion of the semiconductor device, and hence, it is further considered that the gold layer 8 will not exist on the wiring layer 2 after such a heating step is carried out.

As illustrated in FIG. 1C, the semiconductor device illustrated in FIG. 1A is electrically connected to a printed wiring board 34 through the solder ball 101.

FIG. 2A is an enlarged view of the wiring layer 2 and the solder ball 101, wherein the solder ball 101 is composed of Sn—Pb eutectic solder containing tin 82 at 63% and lead 83 at 37%. FIG. 2B is a partially enlarged view of a boundary between the wiring layer 2 and the solder ball 101. As illustrated in FIG. 2B, a Cu—Sn alloy layer 81 having a thickness of 1.75 micrometer to 2.0 micrometer is sandwiched between the wiring layer 2 and the solder ball 101.

A method of fabricating the conventional semiconductor device illustrated in FIGS. 1A to 1C is explained hereinbelow with reference to FIGS. 3A to 3H and 4A to 4H. FIGS. 3A to 3H are partial cross-sectional views of the semiconductor device illustrated in FIG. 1A.

First, as illustrated in FIG. 3A, the wiring layer 2 containing copper therein is formed on an upper surface of the film substrate 3, and the adhesive layer 31 is formed on a lower surface of the film substrate 3. The film substrate 3 has a thickness of 12 micrometers, the wiring layer 2 has a thickness of 18 micrometers, and the adhesive layer 31 has a thickness of 10 micrometers. The film substrate 3 is composed of a material having a resistant to a temperature of 250 degrees centigrade or greater, such as polyimide. The adhesive layer 31 is composed of polyimide.

Then, as illustrated in FIG. 3B, the wiring layer 2 is patterned into a predetermined pattern.

Then, as illustrated in FIG. 3C, the patterned wiring layer 2 and the film substrate 3 are both covered with the resist 32.

Then, as illustrated in FIG. 3D, there is formed the through-hole 4 through the adhesive layer 31 and the wiring layer 2, for instance, by means of a laser beam gun.

Then, as illustrated in FIG. 3E, the through-hole 4 is filled with the metal 5 such as copper or aluminum.

Then, as illustrated in FIG. 3F, the metal 5 is covered at a top surface thereof with the gold layer 6.

Then, as illustrated in FIG. 3G, the resist 32 is formed with the land 7 above the wiring layer 2. In later steps, the solder ball 101 is mounted on the wiring layer 2 in the land 7.

Then, as illustrated in FIG. 3H, the land 7 is covered with the thin gold layer 8.

Thus, there is completed a tape substrate 93 comprised of the film substrate 3 having the wiring layer 2 formed on the upper surface. Though FIGS. 3A to 3H illustrate only one land 7, it should be noted that the film substrate 3 is in the form of a sheet, and the film substrate 3 is formed with a plurality of lands 7 in each of which the solder ball 101 is to be mounted in later steps.

A method of mounting solder balls on the wiring layer 2 is explained hereinbelow with reference to FIGS. 4A to 4H.

First, as illustrated in FIG. 4A, the tape substrate 93 resulted from the steps illustrated in FIGS. 3A to 3H is placed with the gold layer 6 being upwardly directed. For simplification, the gold layer 6 is not illustrated in FIG. 4A.

Then, as illustrated in FIG. 4B, stiffeners 41 are adhered on the tape substrate 93 at opposite its opposite ends. The stiffeners 41 are composed of copper or stainless, for instance. The stiffeners 41 are used for fixing the tape substrate 93 when the semiconductor chip 1 is mounted onto the tape substrate 93.

Then, as illustrated in FIG. 4C, the semiconductor chip 1 is mounted on the tape substrate 93, surrounded by the stiffeners 41. Then, the gold layer 6 is electrically connected to an electrode 12 of the semiconductor chip 1 through a bonding wire (not illustrated). The connection is accomplished by means of a bonding tool, a heater and a ultrasonic wave generator (not illustrated).

Then, as illustrated in FIG. 4D, resin 42 is applied between the tape substrate 93 and the semiconductor chip 1, and then, is cured to thereby reinforce a connection between the tape substrate 93 and the semiconductor chip 1. The resin 42 is composed of epoxy resin in liquid, for instance.

Then, as illustrated in FIG. 4E, a product resulted from the step illustrated in FIG. 4D is covered with a cover 43 for the purpose of protection of the semiconductor chip 1. Then, the cover 43 is sealed under atmospheric pressure. The cover 43 is made of Cu, Al or SiC, for instance.

Electrically conductive adhesive 44 such as Ag paste or Cu paste is coated on a lower surface of the cover 43. The adhesive 44 is heated, and hence, cured when the cover 43 is sealed.

Then, as illustrated in FIG. 4F, the solder balls 101 are absorbed to a positioner 45, and subsequently, the solder balls 101 are mounted onto the lands 7 formed above the wiring layer 2. Thereafter, flux (not illustrated) is applied across the solder balls 101 and the lands 7. Then, the solder balls 7 are caused to reflow to thereby physically connect the solder balls 101 to the lands 7. Then, the flux is washed out.

Thus, there is completed such a product as illustrated in FIG. 4G. The product is then subject to a temperature cycle test in order to test performances and resistance to damages.

Then, as illustrated in FIG. 4H, the solder balls 101 are caused to reflow to thereby physically connect the solder balls 101 to the printed wiring board 34. Thus, there is completed a semiconductor device as a final product.

However, the conventional semiconductor device illustrated in FIGS. 1A to 1C is accompanied with the following problem.

As mentioned earlier, a semiconductor chip is highly and highly integrated in order to meet requirement of fabricating a semiconductor device in a smaller size and a smaller weight. In a more highly integrated semiconductor chip, the greater number of pins has to be formed per a unit area of a semiconductor chip, resulting in a smaller spacing between adjacent pins. As the number of pins is increased, the number of external terminals, that is, solder balls to be connected to one semiconductor chip is also increased, resulting in a smaller spacing between adjacent solder balls.

In general, as a spacing between adjacent solder balls is decreased, a contact area through which a solder ball is connected to a wiring layer is also decreased. As a result, a connection strength between a solder ball and a wiring layer is reduced.

As explained above, in the conventional semiconductor device illustrated in FIGS. 1A to 1C, since a contact area through which the solder ball 101 makes contact with the wiring layer 2 is relatively small, a connection strength between the solder ball 101 and the wiring layer 2 is resultingly small. Accordingly, a connection at which the solder ball 101 is connected to the wiring layer 2 is likely to be broken or cracked, resulting in separation of the solder ball 101 from the wiring layer 2. This results in deterioration in fabrication yield of the semiconductor device.

SUMMARY OF THE INVENTION

In view of the above-mentioned problem, it is an object of the present invention to provide a semiconductor device which is capable of preventing separation of a solder ball from a wiring layer, and further, to provide a method of fabricating a semiconductor device which method is capable of doing the same.

In order to solve the above-mentioned problem, the inventors had studied enhancement in strength at a connection between a solder ball and a wiring layer. As a result of the long-term study, the inventors had found out that it would be possible to enhance the strength by forming a copper-tin alloy layer between a solder ball and a wiring layer to thereby prevent occurrence of breakage and cracking at a connection between a solder ball and a wiring layer. The inventors had further found out that it would be possible to form a copper-tin alloy layer by keeping a solder ball mounted on a wiring layer, at a temperature equal to or greater than a melting point of the solder ball for a predetermined period of time in inactive or reducing gas atmosphere.

Specifically, in one aspect of the present invention, there is provided a semiconductor device including (a) a semiconductor chip, (b) a wiring making electrical connection with the semiconductor chip and containing copper (Cu) therein, (c) a solder ball making contact with the wiring and containing tin (Sn) therein, and (d) a layer made of copper-tin (Cu—Sn) alloy, sandwiched between the wiring and the solder ball, and having a thickness equal to or greater than about 1.87 micrometers.

If the copper-tin alloy layer had a thickness smaller than 1.87 micrometers, it would be impossible to sufficiently enhance a strength at a connection between a solder ball and a wiring layer, resulting in that the connection might be broken or cracked in a heating step such as a temperature cycle test, in which case, a solder ball is separated from a wiring layer.

However, it would be possible to enhance a strength at a connection between a solder ball and a wiring layer by forming the above-mentioned copper-tin alloy layer having a thickness equal to or greater than about 1.87 micrometers, between the solder ball and the wiring layer. As a result, it would be possible to prevent or reduce occurrence of breakage or cracking at the connection, ensuring that the solder ball is not separated from the wiring layer. Thus, the present invention enhances a strength at the connection, and hence, enhances a fabrication yield of a semiconductor device.

It is preferable that the copper-tin alloy layer has a thickness equal to or greater than 2 micrometers, and more preferable that the copper-tin alloy layer has a thickness equal to or greater than 3 micrometers.

There is further provided a semiconductor device including (a) a semiconductor chip, (b) a wiring making electrical connection with the semiconductor chip, having first and second surfaces, and containing copper (Cu) therein, (c) a solder ball making contact with the wiring at the first surface and containing tin (Sn) therein, (d) a film substrate making contact with the wiring at the second surface, the film substrate being formed with a through-hole reaching the wiring, (e) an electrical conductor filling the through-hole therewith, (f) a first layer covering the electrical conductor therewith at the opposite side of the wiring, and made of gold, and (g) a second layer made of copper-tin alloy, sandwiched between the wiring and the solder ball, and having a thickness equal to or greater than about 1.87 micrometers.

The above-mentioned semiconductor chip makes it possible to enhance a strength at a connection between a solder ball and a wiring layer by forming the above-mentioned copper-tin alloy layer having a thickness equal to or greater than about 1.87 micrometers, between the solder ball and the wiring layer. As a result, it would be possible to prevent or reduce occurrence of breakage or cracking at the connection, ensuring that the solder ball is not separated from the wiring layer. Thus, the present invention enhances a strength at the connection, and hence, enhances a fabrication yield of a semiconductor device.

It is preferable that the solder ball contains agglomerates scattering therein, the agglomerates being composed of material other than tin.

For instance, the agglomerates are composed of lead (Pb) scattering at a density of $20 \times 10^4$ mm$^{-3}$ or greater.

If the lead agglomerates scatters at a density smaller than $20\times10^4$ mm$^{-3}$, a solder ball is likely to be deformed by the lead agglomerates, in which case, a connection between a solder ball and a wiring layer might be broken and cracked in a heating step such as a temperature cycle test, and hence, it would be impossible to prevent separation of the solder ball from the wiring layer.

However, if a solder ball contains lead agglomerates at a density of $20\times10^4$ mm$^{-3}$ or greater, it would be possible to prevent deformation of the solder ball, and hence, occurrence of breakage and cracking at the connection. As a result, it would be possible to prevent separation of the solder ball from the wiring layer which separation is caused by the above-mentioned breakage and cracking of the connection. Thus, the present invention enhances a strength at the connection, and hence, enhances a fabrication yield of a semiconductor device It is preferable that the lead agglomerates have a cross-sectional area of 10 square micrometer or smaller in average.

If the lead agglomerates have a cross-sectional area greater than 10 square micrometer in average, a solder ball is likely to be deformed by the lead agglomerates, in which case, a connection between a solder ball and a wiring layer might be broken and cracked in a heating step such as a temperature cycle test, and hence, it would be impossible to prevent separation of the solder ball from the wiring layer.

However, if the lead agglomerates have a cross-sectional area of 10 square micrometer or smaller in average, it would be possible to prevent deformation of the solder ball, and hence, occurrence of breakage and cracking at the connection. As a result, it would be possible to prevent separation of the solder ball from the wiring layer which separation is caused by the above-mentioned breakage and cracking of the connection. Thus, the present invention enhances a strength at the connection, and hence, enhances a fabrication yield of a semiconductor device The semiconductor device may further include a printed wiring board making electrical connection with the solder ball.

In another aspect of the present invention, there is provided a method of fabricating a semiconductor device, including the steps of (a) forming a wiring containing copper (Cu), on a substrate, (b) mounting a solder ball containing tin (Sn), on the wiring, and (c) keeping a product resulted from the step (b), in inactive gas atmosphere or in reducing gas atmosphere at a temperature equal to or greater than a melting point of the solder ball.

In accordance with the above-mentioned method, tin contained in the solder ball is diffused in liquid into the wiring layer containing copper, resulting in that a copper-tin alloy layer is formed between the solder ball and the wiring layer, having a thickness sufficient to prevent the solder ball from being separated from the wiring layer. The thus formed copper-tin alloy layer enhances a strength of a connection between the solder ball and the wiring layer, and hence, ensures that the connection is not broken and cracked. Thus, the present invention enhances a strength at the connection, and hence, enhances a fabrication yield of a semiconductor device.

The product resulted from the step (b) is kept in an inactive or reducing gas atmosphere for a predetermined period of time sufficient to enhance a strength of a connection between the solder ball and the wiring layer.

For instance, the product is kept in an inactive or reducing gas atmosphere for an hour or longer.

There is further provided a method of fabricating a semiconductor device, including the steps of (a) forming a wiring containing copper (Cu), on a substrate, (b) covering the wiring with a resist having a recess through which the wiring appears, (c) forming a through-hole through the substrate so that the through-hole reaches the wiring, (d) filling electrical conductor in the through-hole, (e) covering the electrical conductor with a gold layer, (f) connecting the substrate to a semiconductor chip. (g) mounting a solder ball containing tin (Sn), in the recess, and (h) keeping a product resulted from the step (g), in inactive gas atmosphere or in reducing gas atmosphere at a temperature equal to or greater than a melting point of the solder ball.

In accordance with the above-mentioned method, tin contained in the solder ball is diffused in liquid into the wiring layer containing copper, resulting in that a copper-tin alloy layer is formed between the solder ball and the wiring layer, having a thickness sufficient to prevent the solder ball from being separated from the wiring layer. The thus formed copper-tin alloy layer enhances a strength of a connection between the solder ball and the wiring layer, and hence, ensures that the connection is not broken and cracked. Thus, the present invention enhances a strength at the connection, and hence, enhances a fabrication yield of a semiconductor device.

The method may further include the step of forming a gold layer on the wiring in advance of mounting the solder ball on the wiring.

By forming a gold layer on the wiring and then mounting the solder ball on the gold layer, it would be possible to prevent the wiring layer from being oxidized.

There is provided a semiconductor device including (a) a semiconductor chip, (b) a wiring making electrical connection with the semiconductor chip and containing copper (Cu) therein, (c) a solder ball making contact with the wiring and containing tin (Sn) therein, and (d) a layer made of copper-tin (Cu—Sn) alloy, sandwiched between the wiring and the solder ball, and having a thickness equal to or greater than about 1.87 micrometers, the semiconductor device being resulted from the steps of (a) forming the wiring on a substrate, (b) mounting the solder ball on the wiring, and (c) keeping a product resulted from the step (b), in inactive gas atmosphere or in reducing gas atmosphere at a temperature equal to or greater than a melting point of the solder ball.

There is further provided a semiconductor device including (a) a semiconductor chip, (b) a wiring making electrical connection with the semiconductor chip and containing copper (Cu) therein, and (c) a solder ball making contact with the wiring and containing tin (Sn) therein, the solder ball containing lead (Pb) agglomerates scattering therein at a density of $20\times10^4$ mm$^{-3}$ or greater, the semiconductor device being resulted from the steps of (a) forming the wiring on a substrate, (b) mounting the solder ball on the wiring, and (c) keeping a product resulted from the step (b), in inactive gas atmosphere or in reducing gas atmosphere at a temperature equal to or greater than a melting point of the solder ball.

There is still further provided a semiconductor device including (a) a semiconductor chip, (b) a wiring making electrical connection with the semiconductor chip and containing copper (Cu) therein, and (c) a solder ball making contact with the wiring and containing tin (Sn) therein, the solder ball containing lead (Pb) agglomerates scattering therein, the lead agglomerates having a cross-sectional area of 10 square micrometer or smaller in average, the semiconductor device being resulted from the steps of (a) forming the wiring on a substrate, (b) mounting the solder ball on the wiring, and (c) keeping a product resulted from the step (b), in inactive gas atmosphere or in reducing gas atmosphere at a temperature equal to or greater than a melting point of the solder ball.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 8A to 8I are cross-sectional view of a semiconductor device, each illustrating respective steps of a method of fabricating the semiconductor device illustrated in FIG. 5A.

DESCRIPTION OF THE PREFERRED EMBODIMENTS

Figure 5A:
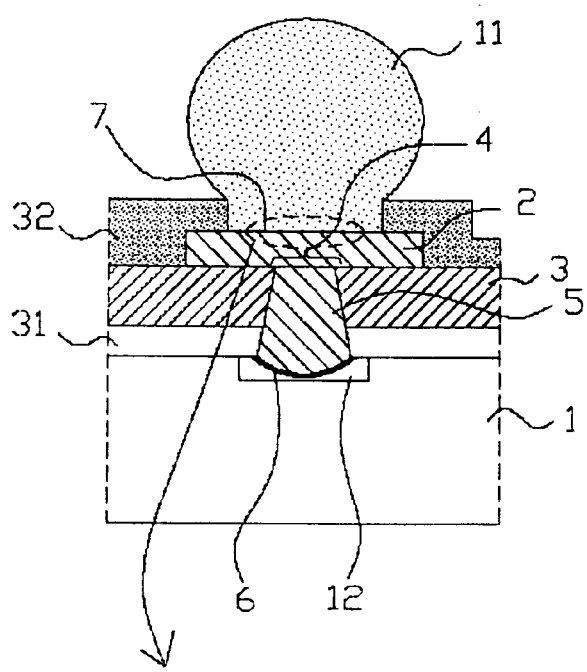
FIG. 5A is a cross-sectional view of a semiconductor device in accordance with a preferred embodiment of the present invention.
Figure 5B:
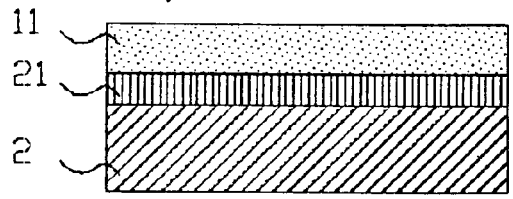
FIG. 5B is an enlarged view of a connection between a wiring layer and a solder ball.
Figure 5C:
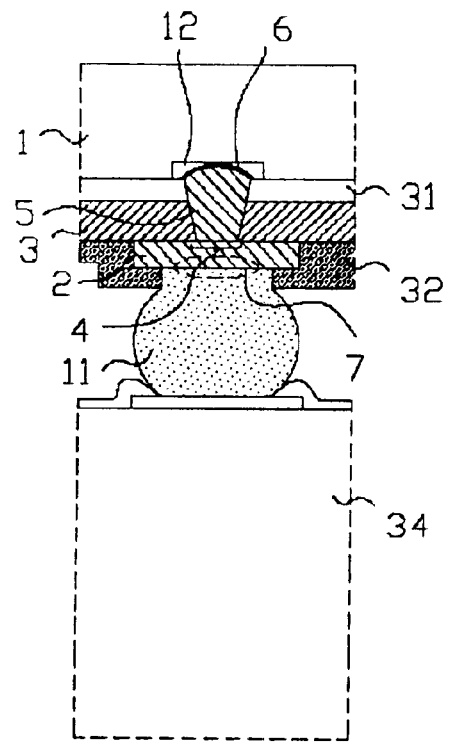
FIG. 5C is a cross-sectional view illustrating that the semiconductor device illustrated in FIG. 5A is electrically connected to a printed wiring board.

FIGS. 5A to 5C illustrate a semiconductor device in accordance with the first embodiment of the present invention.

As illustrated in FIG. 5A, the semiconductor device is comprised of a semiconductor chip 1, a film substrate 3, a polyimide adhesive layer 31 adhering the film substrate 3 to the semiconductor chip 1, a resist 32 covering the wiring layer 2 therewith and formed with a land 7 which is a recess formed at a surface thereof, a wiring layer 2 formed on the film substrate 3, a solder ball 11 mounted on the wiring layer 2 in the land 7, a layer 21 (see FIG. 5B) made of copper-tin alloy and sandwiched between the solder ball 11 and the wiring layer 2, a metal 5 filled in a through-hole 4 formed through both the film substrate 3 and the polyimide adhesive layer 31, and a gold (Au) layer 6 covering therewith the metal 5 at a top surface thereof.

The wiring layer 2 is in electrical connection with the semiconductor chip 1, and contains copper (Cu) therein. The solder ball 11 contains tin (Sn) therein.

In the semiconductor device in accordance with the first embodiment, the through-hole 4 is formed just above an electrode 12 of the semiconductor chip 12. The solder ball 11 is electrically connected to the electrode 12 through the metal 5 filled in the through-hole 4. It is not always necessary that the solder ball 11 is located just above the electrode 12.

As illustrated in FIG. 5C, the semiconductor device in accordance with the first embodiment further includes a printed wiring board 34 electrically connected to the solder ball 11.

Figure 6B:
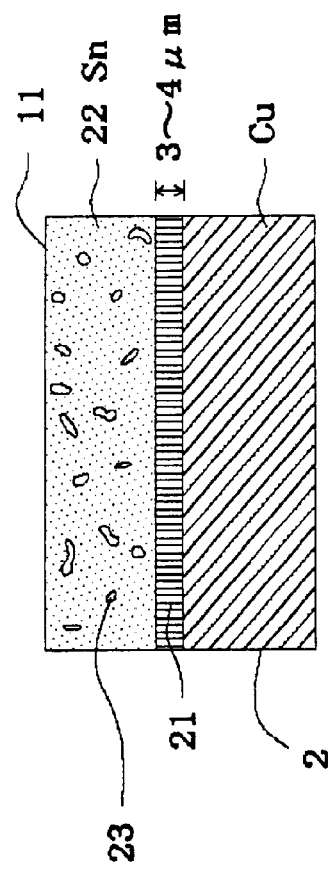
FIG. 6B is a partially enlarged view of a connection between a wiring layer and a solder ball in the semiconductor device illustrated in FIG. 6A.
Figure 6A:
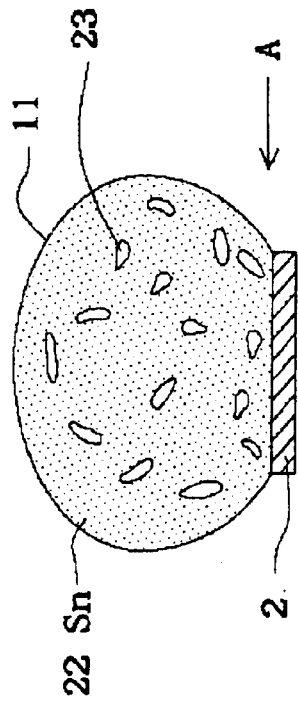
FIG. 6A is an enlarged view of a solder ball in the semiconductor device illustrated in FIG. 5A.

FIG. 6A is an enlarged view of the wiring layer 2 and the solder ball 11, wherein the solder ball 11 is composed of Sn—Pb eutectic solder containing tin 22 at 65% and lead at 35%. FIG. 6B is a partially enlarged view of a boundary between the wiring layer 2 and the solder ball 101. As illustrated in FIG. 6B, the Cu—Sn alloy film 21 having a thickness of 3 micrometer to 4 micrometer is sandwiched between the wiring layer 2 and the solder ball 11.

The solder ball 11 predominantly contains tin (Sn). Though the layer 21 sandwiched between the solder ball 11 and the wiring layer 2 is composed of Cu—Sn alloy in the first embodiment, the layer 21 may be composed of Sn—Pb alloy or Sn—Ag alloy. As an alternative, the layer 21 may be free of Pb. For instance, the layer 21 may be composed of Sn—An alloy, Sn—Bi alloy, Sn—Ni alloy, Sn—Cd alloy, Sn—S alloy, Sn—As alloy, or Sn—Zn alloy.

As mentioned earlier, the Cu—Sn alloy layer 21 is sandwiched between the solder ball 11 and the wiring layer 2 in the first embodiment. The Cu—Sn alloy layer 21 makes it possible to prevent occurrence of breakage and cracking across the solder ball 11 and the wiring layer 2, preventing that the solder ball 11 is separated from the wiring layer 2 due to the breakage and/or cracking across the solder ball 11 and the wiring layer 2. As a result, it would be possible to enhance a fabrication yield of the semiconductor device.

The Cu—Sn alloy layer 21 has a thickness preferably of 1.87 micrometers or greater, more preferably of 2 micrometers or greater, and most preferably of 3 micrometers or greater.

When the solder ball 11 contains materials other than tin (Sn), those materials generally exist in the form of agglomerates. As those agglomerates are larger in size, the solder ball 11 is more likely to be deformed, and hence, breakage and cracking are more likely to occur at a connection between the solder ball 11 and the wiring layer 2. Hence, the agglomerates have to be scattered in a smaller size in the solder ball 11.

For instance, when the solder ball 11 contains lead (Pb) 23 as well as tin (Sn) 22, as illustrated in FIGS. 6A and 6B, it is preferable that the lead 23 scatters in the solder ball 11 in the form of small agglomerates.

A method of fabricating the semiconductor device in accordance with the first embodiment, illustrated in FIGS. 5A to 5C, is explained hereinbelow with reference to FIGS. 7A to 7G and 8A to 8I.

Figure 7A:
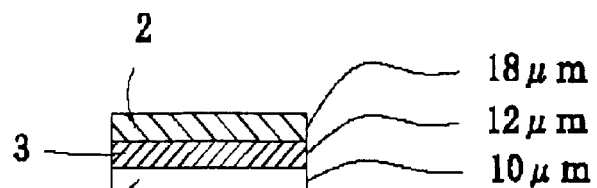
FIGS. 7A to 7G are cross-sectional view of a semiconductor device, each illustrating respective steps of a method of fabricating the semiconductor device illustrated in FIG. 5A.

First, as illustrated in FIG. 7A, the wiring layer 2 containing copper therein is formed on an upper surface of the film substrate 3, and the adhesive layer 31 is formed on a lower surface of the film substrate 3. The film substrate 3 has a thickness of 12 micrometers, the wiring layer 2 has a thickness of 18 micrometers, and the adhesive layer 31 has a thickness of 10 micrometers. The film substrate 3 is composed of a material having a resistant to a temperature of 250 degrees centigrade or greater, such as polyimide. The adhesive layer 31 is composed of polyimide.

Figure 7B:
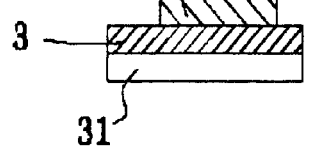

Then, as illustrated in FIG. 7B, the wiring layer 2 is patterned into a predetermined pattern.

Figure 7C:
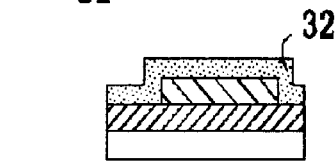

Then, as illustrated in FIG. 7C, the patterned wiring layer 2 and the film substrate 3 are both covered with the resist 32.

Figure 7D:
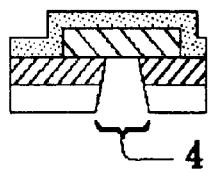

Then, as illustrated in FIG. 7D, there is formed the through-hole 4 through the adhesive layer 31 and the film substrate 3, for instance, by means of a laser beam gun.

Figure 7E:
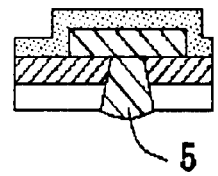

Then, as illustrated in FIG. 7E, the through-hole 4 is filled with the metal 5 such as copper or aluminum.

Figure 7F:
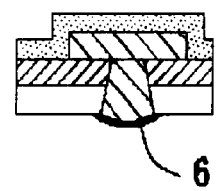

Then, as illustrated in FIG. 7F, the metal 5 is covered at a top surface thereof with the gold layer 6.

Figure 7G:
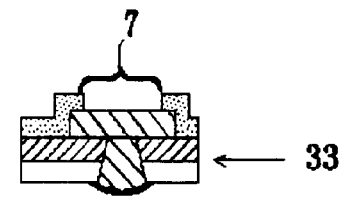

Then, as illustrated in FIG. 7G, the resist 32 is formed with the land 7 above the wiring layer 2. In later steps, the solder ball 11 is mounted on the wiring layer 2 in the land 7.

Thus, there is completed a tape substrate 33 comprised of the film substrate 3 having the wiring layer 2 formed on the upper surface. Though FIGS. 7A to 7G illustrate only one land 7, it should be noted that the film substrate 3 is in the form of a sheet, and the film substrate 3 is formed with a plurality of lands 7 in each of which the solder ball 11 is to be mounted in later steps.

A method of mounting the solder balls 11 on the wiring layer 2 is explained hereinbelow with reference to FIGS. 8A to 8I.

Figure 8A:
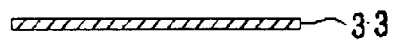

First, as illustrated in FIG. 8A, the tape substrate 33 resulted from the steps illustrated in FIGS. 7A to 7G is placed with the gold layer 6 being upwardly directed. For simplification, the gold layer 6 is not illustrated in FIG. 8A.

Figure 8B:

Then, as illustrated in FIG. 8B, stiffeners 41 are adhered on the tape substrate 33 at its opposite ends. The stiffeners 41 are composed of copper or stainless, for instance.

Figure 8C:

Then, as illustrated in FIG. 8C, the semiconductor chip 1 is mounted on the tape substrate 93, surrounded by the stiffeners 41. Then, the gold layer 6 is electrically connected to the electrode 12 of the semiconductor chip 1 through a bonding wire (not illustrated). The connection is accomplished by means of a bonding tool, a heater and a ultrasonic wave generator (not illustrated).

Figure 8D:
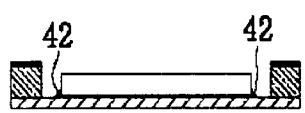

Then, as illustrated in FIG. 8D, resin 42 is applied between the tape substrate 33 and the semiconductor chip 1, and then, is cured to thereby reinforce a connection between the tape substrate 33 and the semiconductor chip 1. The resin 42 is composed of epoxy resin in liquid, for instance.

Figure 8E:
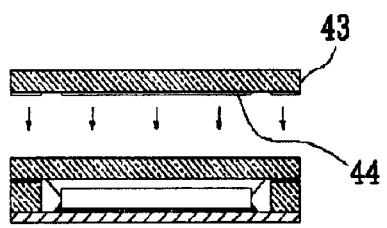

Then, as illustrated in FIG. 8E, a product resulted from the step illustrated in FIG. 8D is covered with a cover 43 for the purpose of protection of the semiconductor chip 1. Then, the cover 43 is sealed under atmospheric pressure. The. cover 43 is made of Cu, Al or SiC, for instance.

Electrically conductive adhesive 44 such as Ag paste or Cu paste is coated on a lower surface of the cover 43. The adhesive 44 is heated, and hence, cured when the cover 43 is sealed.

Figure 8F:
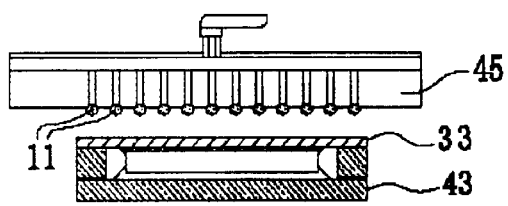

Then, as illustrated in FIG. 8F, the solder balls 11 are absorbed to a positioner 45, and subsequently, the solder balls 11 are mounted onto the lands 7 formed above the wiring layer 2. Thereafter, flux (not illustrated) is applied across the solder balls 11 and the lands 7. Then, the solder balls 11 are caused to reflow to thereby physically connect the solder balls 11 to the lands 7. Then, the flux is washed out.

Figure 8G:
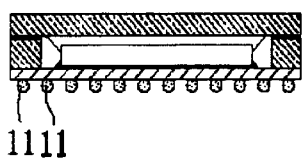

Thus, there is completed such a product as illustrated in FIG. 8G. The thus obtained product is kept at a temperature equal to or higher than a melting point of the solder ball 11 for a predetermined period of time, for instance, an hour, in inactive or reducing gas atmosphere, as illustrated in FIG. 8H.

The resultant is then subject to a temperature cycle test in order to test performances and resistance to damages.

Figure 8I:
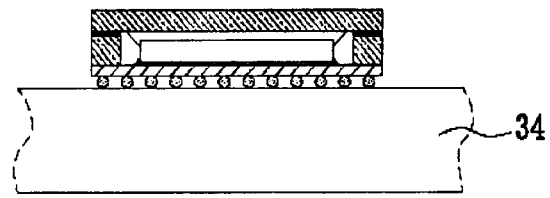

Then, as illustrated in FIG. 8I, the solder balls 11 are caused to reflow to thereby physically connect the solder balls 11 to the printed wiring board 34. Thus, there is completed a semiconductor device as a final product.

As mentioned earlier, by keeping the product illustrated in FIG. 8G at a temperature equal to or higher than a melting point of the solder ball 11 for a predetermined period of time in inactive or reducing gas atmosphere, tin contained in the solder ball 11 and copper contained in the wiring layer 2 are coupled with each other to thereby form the Cu—Sn alloy layer 21 between the solder ball 11 and the wiring layer 2.

Herein, an inactive gas atmosphere indicates an atmosphere of gas which does not react with both the solder ball 11 and the wiring layer 2, such as $N_2$, Ar, He and Ne alone or in combination. A reducing gas atmosphere indicates an atmosphere of reducing gas such as CO or $H_2$.

By keeping the product illustrated in FIG. 8G at a temperature equal to or higher than a melting point of the solder ball 11 for a predetermined period of time in inactive or reducing gas atmosphere, tin contained in the solder ball 11 is diffused in liquid into copper matrix in the wiring layer 2, resulting in that the Cu—Sn alloy layer 21 having a thickness sufficient to prevent separation of the solder ball 11 from the wiring layer 2 is formed between the solder ball 11 and the wiring layer 2. Hence, a connection between the solder ball 11 and the wiring layer 2 could have an enhanced strength, which ensures that the connection is unlikely to be broken and cracked. As a result, it would be possible to reduce defective semiconductor devices in which the solder ball 11 is broken or cracked, and hence, to enhance a fabrication yield of the semiconductor device.

Figure 1A:
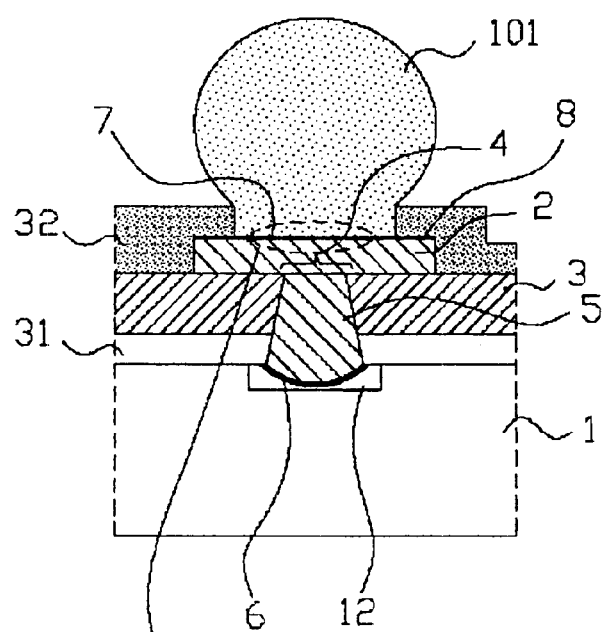
FIG. 1A is a cross-sectional view of a conventional semiconductor device.
Figure 1B:
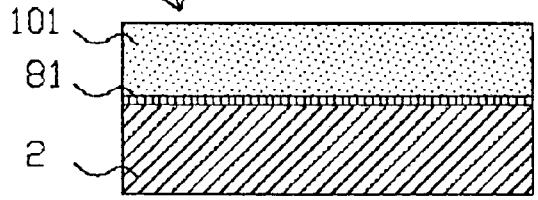
FIG. 1B is an enlarged view of a connection between a wiring layer and a solder ball.
Figure 1C:
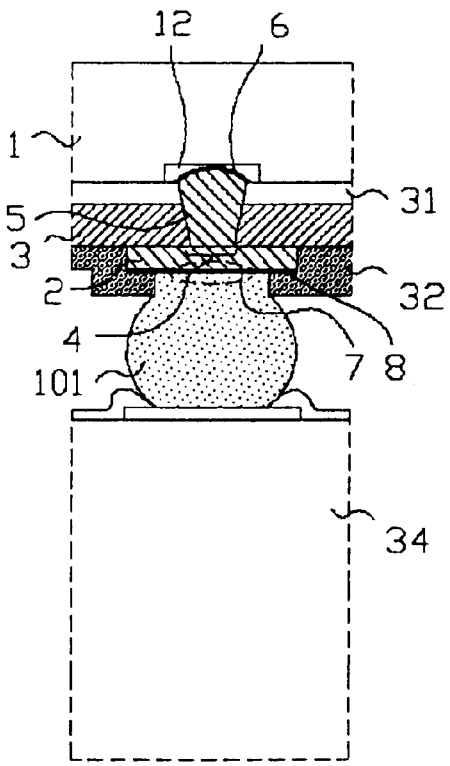
FIG. 1C is a cross-sectional view illustrating that the semiconductor device illustrated in FIG. 1A is electrically connected to a printed wiring board.

In the first embodiment, a thin gold layer is not formed on the wiring layer 2 in the land 7 unlike the conventional semiconductor device illustrated in FIG. 1A. However, the formation of the thin gold layer on the wiring layer would prevent the wiring layer 2 from being oxidized and facilitate formation of the Cu—Sn alloy layer 21. Hence, a thin gold layer such as the gold layer 8 illustrated in FIGS. 1A and 1C may be deposited on the wiring layer 2 even in the first embodiment.

EXAMPLE 1

Hereinbelow is explained a first example of the semiconductor device in accordance with the above-mentioned embodiment, illustrated in FIGS. 5A to 5C. In Example 1, the solder ball 11 is composed of Sn—Pb eutectic solder including Sn at 63% and Pb at 37%. FIG. 6A is an enlarged view of the solder ball 11, and FIG. 6B is a partially enlarged view of the solder ball 11, the Cu—Sn alloy layer 21, and the wiring layer 2.

As illustrated in FIG. 6B, the Cu—Sn alloy layer 21 is formed between the solder ball 11 and the wiring layer 2. The Cu—Sn alloy layers 21 in the semiconductor device in accordance with the above-mentioned embodiment have a thickness in the range of 1.87 micrometers to 4.0 micrometers. Most of the Cu—Sn alloy layers 21 have a thickness in the range of 3.0 micrometers to 4.0 micrometers.

Figures 2A, 2B:
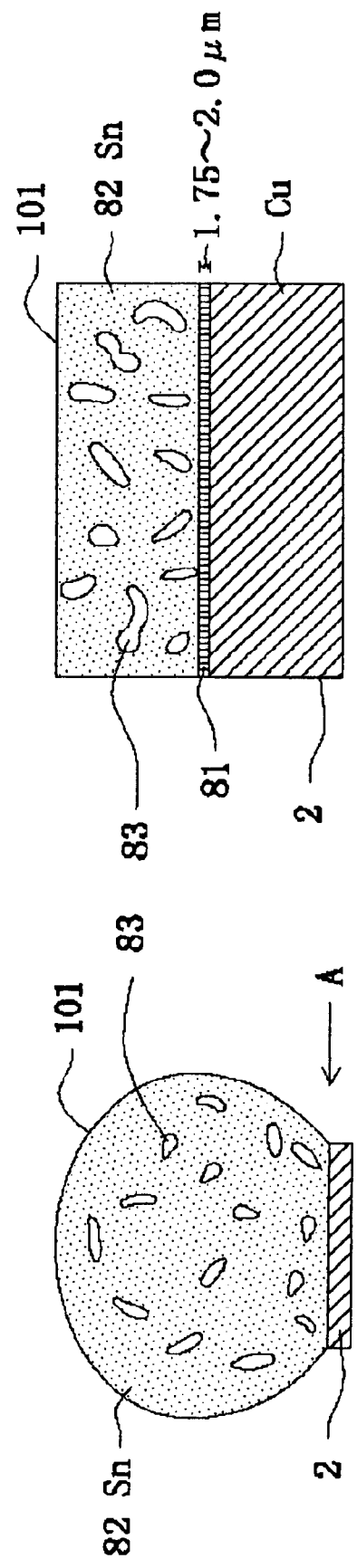
FIG. 2A is an enlarged view of a solder ball in the semiconductor device illustrated in FIG. 1A.
FIG. 2B is a partially enlarged view of a connection between a wiring layer and a solder ball in the semiconductor device illustrated in FIG. 2A.
Figure 3A:
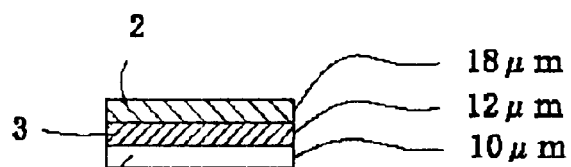
FIGS. 3A to 3H are cross-sectional view of a semiconductor device, each illustrating respective steps of a method of fabricating the conventional semiconductor device illustrated in FIG. 1A.
Figure 3B:
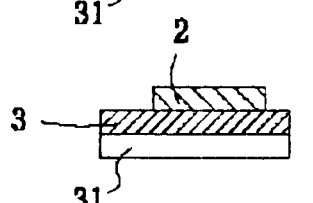
Figure 3C:
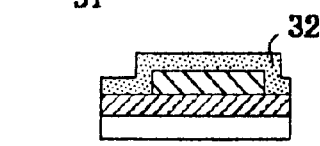
Figure 3D:
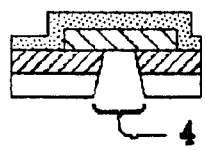
Figure 3E:
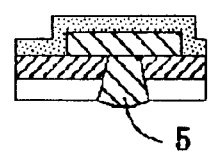
Figure 3F:
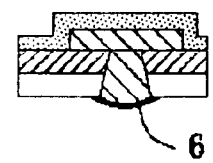
Figure 3G:
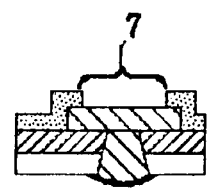
Figure 3H:
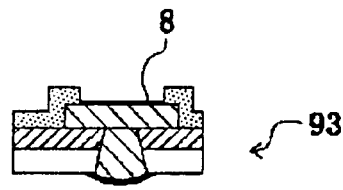
Figure 4A:
FIGS. 4A to 4H are cross-sectional view of a semiconductor device, each illustrating respective steps of a method of fabricating the conventional semiconductor device illustrated in FIG. 1A.
Figure 4B:
Figure 4C:
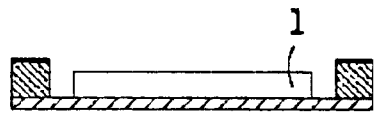
Figure 4D:
Figure 4E:
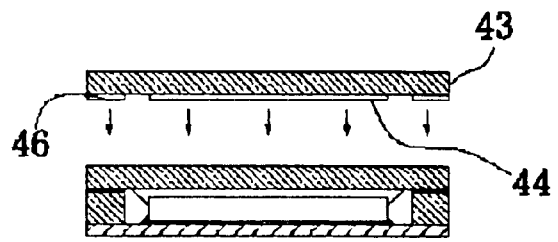
Figure 4F:
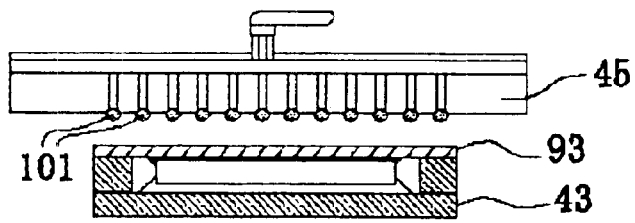
Figure 4G:
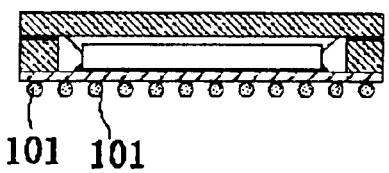
Figure 4H:
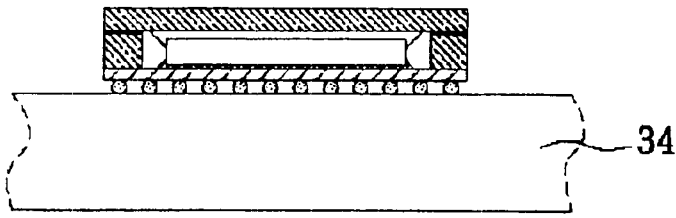

In contrast, most of the Cu—Sn alloy layers 21 in the conventional semiconductor device illustrated in FIGS. 2A and 2B have a thickness in the range of 1.0 micrometers to 1.5 micrometers. This indicates that the Cu—Sn alloy layer 21 is thicker in the above-mentioned embodiment than in the conventional semiconductor device.

Thus, the Cu—Sn layer 21 is required to have a thickness equal to 1.87 micrometers at smallest in order to prevent the solder ball 11 from being separated from the wiring layer 2. As will be understood in view of comparison between the conventional semiconductor device and the above-mentioned embodiment, the Cu—Sn layer 21 having a thickness equal to or greater than 1.87 micrometers can enhance a strength at a connection of the solder ball 11 and the wiring layer 2, resulting in reduction in occurrence of breakage and/or cracking of the connection. This ensures a higher fabrication yield of the semiconductor device.

As mentioned earlier, when the solder ball 11 contains materials other than tin (Sn), those materials generally exist in the form of agglomerates. The solder ball 11 illustrated in FIGS. 6A and 6B contain lead in the form of agglomerates. As those lead agglomerates 23 are larger in size, the solder ball 11 is more likely to be deformed, and hence, breakage and cracking are more likely to occur at a connection between the solder ball 11 and the wiring layer 2. Hence, the lead agglomerates 23 have to be scattered in a smaller size in the solder ball 11.

The solder ball 11 illustrated in FIGS. 6A and 6B contains the lead agglomerates 23 at a density of $20 \times 10^4$ mm$^{-3}$ or greater. In contrast, the solder ball 101 in the conventional semiconductor device, illustrated in FIGS. 2A and 2B, contains the lead agglomerates 83 at a density of $15 \times 10^4$ mm$^{-3}$. Thus, it is understood that the solder ball 11 in the semiconductor device in accordance with the above-mentioned embodiment contains the lead agglomerates 23 at a greater density than that of the conventional semiconductor device. That is, the lead agglomerates 23 are scattered more widely than the lead agglomerates 83 in the solder ball 101 in the conventional semiconductor device.

The lead agglomerates 23 in the solder ball 11 illustrated in FIGS. 6A and 6B have a cross-sectional area in the range of 1 to 10 square micrometers. In contrast, the lead agglomerates 83 in the solder ball 101 illustrated in FIGS. 2A and 2B have a cross-sectional area in the range of 10 to 30 square micrometers. Thus, it is understood that the solder ball 11 in the semiconductor device in accordance with the above-mentioned embodiment contains the lead agglomerates 23 in a smaller size than that of the conventional semiconductor device.

As mentioned above, the solder ball 11 in Example 1 contains the lead agglomerates 23 at a greater density and in a smaller size than those of the conventional solder ball 101. As a result, the solder ball 11 in Example 1 is unlikely to be deformed, and it would be possible to prevent occurrence of breakage and/or cracking at the connection between the solder ball 11 and the wiring layer 2. Thus, a semiconductor device can be fabricated in a higher fabrication yield.

EXAMPLE 2

In Example 2, the solder ball 11 is composed of Sn—Pb eutectic solder including Sn at 63% and Pb at 37%, similarly to Example 1. In Example 2, the semiconductor device resulted from the steps illustrated in FIGS. 7A to 7G and 8A to 8G was kept at a temperature equal to or greater than a melting point of the solder ball 11 in N$_2$ gas atmosphere, and then, the printed wiring board 34 was connected to the solder ball 11. Thereafter, a shear strength at the connection between the solder ball 11 and the wiring layer 2 was measured.

Figure 9:
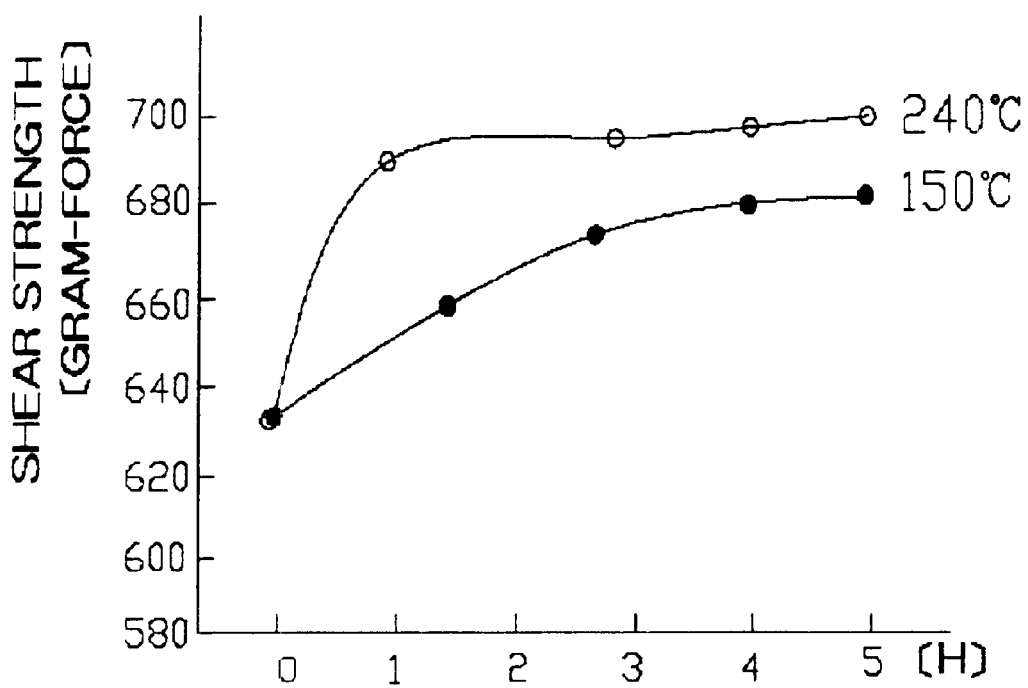
FIG. 9 is a graph showing a shear strength of a connection between a solder ball and a wiring layer.

The result of measurement is shown in FIG. 9 in which an axis of ordinate indicates a shear strength in the unit of gram-force (gf) and an axis of abscissa indicates a period of time in the unit of hour during which the semiconductor device is kept at a temperature equal to or greater than a melting point of the solder ball 11 in N$_2$ gas atmosphere.

In FIG. 9, ○ indicates a shear strength of the connection, measured when the solder ball 11 is kept at 240 degrees centigrade which is higher than a melting point of Cu—Sn eutectic solder, 183 degrees centigrade, and ● indicates a shear strength of the connection, as a reference, measured when the solder ball 11 is kept at 150 degrees centigrade which is lower than a melting point of Cu—Sn eutectic solder, 183 degrees centigrade.

Figure 10:
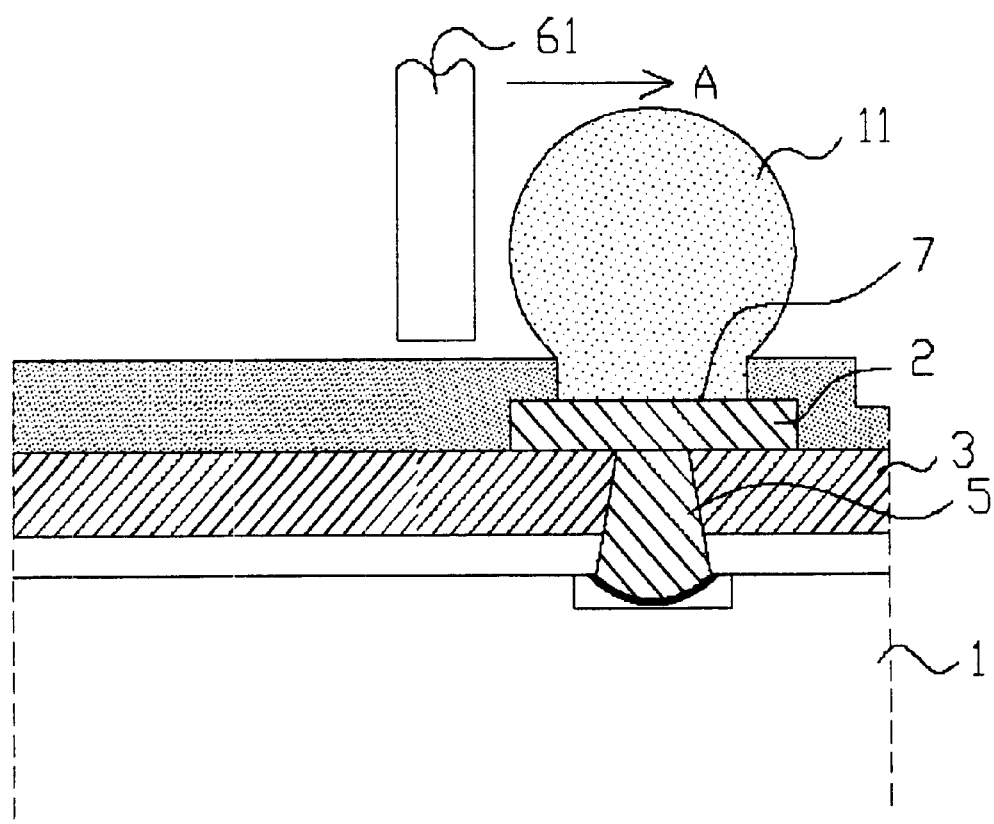
FIG. 10 illustrates an example of an apparatus for measuring a shear strength of a connection between a solder ball and a wiring layer.

A shear strength of the connection was measured by means of an apparatus illustrated in FIG. 10. The illustrated apparatus includes a measurement tool 61 by which the solder ball 11 is sheared at the connection between the solder ball 11 and the wiring layer 2 in a direction indicated with an arrow A, that is, a direction substantially parallel to the connection. A shear strength of the connection was measured when the solder ball 11 is sheared by means of the apparatus.

In Example 2, the solder ball 11 is designed to have a diameter of 0.5 mm, a pitch between adjacent solder balls 11 is 0.8 mm, and the land 7 has a diameter of 0.4 mm. As is obvious in view of FIG. 9, a shear strength is enhanced in a case wherein the semiconductor device is kept at a temperature equal to or greater than a melting point of the solder ball 11 than in a case wherein the semiconductor device is kept at a temperature smaller than a melting point of the solder ball 11. The reason of this is considered that tin contained in the solder ball 11 is diffused in liquid into the wiring layer 2 containing copper by keeping the semiconductor device at a temperature equal to or greater than a melting point of the solder ball 11, and resultingly, a Cu—Sn alloy layer is formed between the solder ball 11 and the wiring layer 2.

According to the experiment which the inventors had conducted, a shear strength of the connection between the solder ball 11 and the wiring layer 2 can be enhanced by 680 gram-forces or greater by keeping the semiconductor device at a temperature equal to or greater than a melting point of the solder ball 11 for an hour or longer. Thus, it would be possible to have the connection had a strength sufficient to prevent the solder ball 11 from being separated from the wiring layer 2.

As illustrated in FIGS. 6A and 6B, the solder ball 11 contains lead 23 in the form of agglomerates. That is, the solder ball 11 contains Cu, Sn and Pb. Table 1 shows thermal expansion coefficients and densities of both ingredients Cu, Sn and Pb contained in the solder ball 11 and Cu—Sn alloy of which the layer 21 is composed.

TABLE 1

| Material | TEC [ppm] | Density [g/cm³] |
|---|---|---|
| Cu | 16.8 | 8.93 |
| Pb | 29 | 11.34 |
| Sn | 21 | 7.28 |
| Cu—Sn alloy | 17.1–17.8 | — |

A thermal expansion coefficient (TEC) is indicated in the unit of ppm, and a density is indicated in the unit of g/cm³.

The larger the lead agglomerates 23 are in size, more likely the solder balls 11 are to be deformed, and hence, are to be broken or cracked at the connection between themselves and the wiring layer 2. Hence, the lead agglomerates 23 have to be as small as possible in order to prevent generation of deformation in the solder balls 11.

In view of Table 1, Pb has a greater thermal expansion coefficient than thermal expansion coefficients of Cu, Sn and Cu—Sn alloy, and in addition Pb has a greater density than densities of Cu and Sn. Accordingly, when the semiconductor device is subject to a temperature cycle test, which is to be carried out at a temperature lower than a melting point of the solder balls 11, the lead agglomerates 23 expands to a greater degree than Cu, Sn and Cu—Sn alloy, and resultingly, the lead agglomerates 23 would have deformation to a greater degree than Cu, Sn and Cu—Sn alloy. Thus, the larger the lead agglomerates 23 are in size, more likely deformation is to be generated in the solder ball 11, and in addition, more likely the solder balls 11 are to be broken or cracked at the connection.

In contrast, in Example 2, the solder balls 11 are kept at a temperature equal to or greater than a melting point thereof, and as a result, the crystal structure of the solder ball 11 is changed so that the lead agglomerates 23 are smaller in size and scattered more widely than the lead agglomerates 83 contained in the conventional solder ball 101 illustrated in FIGS. 2A and 2B.

As mentioned above, in accordance with Example 2, since the lead agglomerates 23 are smaller in size than the lead agglomerates 83 contained in the conventional solder ball 101, the lead agglomerates 23 would have deformation to a smaller degree, and in addition, since the lead agglomerates 23 are scattered more widely than the lead agglomerates 83 contained in the conventional solder ball 101, deformation caused by the lead agglomerates 23 could be dispersed. As a result, the connection between the solder ball 11 and the wiring layer 2 could have. an enhanced strength.

Though the solder ball 11 is composed of Sn—Pb eutectic solder in Example 2, a material of which the solder ball 11 is composed is not to be limited to that. Unless the solder ball 11 contains tin (Sn), the solder ball 11 may contain other elements. For instance, the solder ball 11 may be composed of Sn—Ag alloy, Sn—Zn alloy, Sn—Cd alloy, Sn—Ni alloy, Sn—S alloy, Sn—As alloy, or Sn—Bi alloy.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-61912 filed on Mar. 9, 1999 including specification, claims, drawings and summary is incorporated herein by reference in its entirety.

What is claimed is:

1. A semiconductor device comprising:
    (a) a semiconductor chip;
    (b) a wiring making electrical connection with said semiconductor chip and containing copper (Cu) therein;
    (c) a solder ball making contact with said wiring and containing tin (Sn) therein; and
    (d) a layer made of copper-tin (Cu—Sn) alloy, sandwiched between said wiring and said solder ball, and having a thickness equal to or greater than about 1.87 micrometers,
    (e) said solder ball and said wiring being maintained at a temperature of at least a melting point of said solder ball, shear strength of the connection between said solder ball and said wiring being greater than shear strength of the connection between said solder ball and said wiring if said solder ball and said wiring were maintained at a temperature less than said melting point of said solder ball.

2. The semiconductor device as set forth in claim 1, wherein said copper-tin (Cu—Sn) alloy layer has a thickness equal to or greater than 2 micrometers.

3. The semiconductor device as set forth in claim 2, wherein said copper-tin (Cu—Sn) alloy layer has a thickness equal to or greater than 3 micrometers.

4. The semiconductor device as set forth in claim 1, wherein said solder ball contains agglomerates scattering therein, said agglomerates being composed of material other than tin.

5. The semiconductor device as set forth in claim 4, wherein said agglomerates are composed of lead (Pb), and wherein said lead agglomerates are scattered at a density of $20 \times 10^4$ mm$^{-3}$ or greater.

6. The semiconductor device as set forth in claim 4, wherein said agglomerates are composed of lead (Pb), and wherein said lead agglomerates have a cross-sectional area of 10 square micrometer or smaller in average.

7. The semiconductor device as set forth in claim 1, further comprising a printed wiring board making electrical connection with said solder ball.

8. A semiconductor device comprising:
    (a) a semiconductor chip;
    (b) a wiring making electrical connection with said semiconductor chip, having first and second surfaces, and containing copper (Cu) therein;
    (c) a solder ball making contact with said wiring at said first surface and containing tin (Sn) therein;
    (d) a film substrate making contact with said wiring at said second surface, said film substrate being formed with a through-hole reaching said wiring;
    (e) an electrical conductor filling said through-hole therewith;
    (f) a first layer covering said electrical conductor therewith at the opposite side of said wiring, and made of gold; and
    (g) a second layer made of copper-tin alloy, sandwiched between said wiring and said solder ball, and having a thickness equal to or greater than about 1.87 micrometers,
    said solder ball, said film substrate, and said wiring being maintained at a temperature of at least a melting point of said solder ball, shear strength of the connection between said solder ball and said wiring being greater than shear strength of the connection between said solder ball and said wiring if said solder ball, said film substrate, and said wiring were maintained at a temperature less than said melting point of said solder ball.

9. The semiconductor device as set forth in claim 8, wherein said second layer has a thickness equal to or greater than 2 micrometers.

10. The semiconductor device as set forth in claim 9, wherein said second layer has a thickness equal to or greater than 3 micrometers.

11. The semiconductor device as set forth in claim 8, wherein said solder ball contains agglomerates scattering therein, said agglomerates being composed of material other than tin.

12. The semiconductor device as set forth in claim 11, wherein said agglomerates are composed of lead (Pb), and wherein said lead agglomerates are scattered at a density of $20 \times 10^4$ mm$^{-3}$ or greater.

13. The semiconductor device as set forth in claim 11, wherein said agglomerates are composed of lead (Pb), and wherein said lead agglomerates have a cross-sectional area of 10 square micrometer or smaller in average.

14. The semiconductor device as set forth in claim 8, further comprising a printed wiring board making electrical connection with said solder ball.

15. A semiconductor device comprising:
   (a) a semiconductor chip;
   (b) a wiring making electrical connection with said semiconductor chip and containing copper (Cu) therein;
   (c) a solder ball making contact with said wiring and containing tin (Sn) therein; and
   (d) a layer made of copper-tin (Cu—Sn) alloy, sandwiched between said wiring and said solder ball, and having a thickness equal to or greater than about 1.87 micrometers,
   said semiconductor device resulting from the steps of:
      (a) forming said wiring on a substrate;
      (b) mounting said solder ball on said wiring; and
      (c) keeping a product resulting from said step (b), in inactive gas atmosphere or in reducing gas atmosphere at a temperature equal to or greater than a melting point of said solder ball,
         shear strength of the connection between said solder ball and said wiring being greater than shear strength of the connection between said solder ball and said wiring if said product resulting from step (b) were kept at a temperature lower than said melting point of said solder ball.

16. The semiconductor device as set forth in claim 15, wherein said product resulted from said step (b) is kept in said inactive gas atmosphere or in said reducing gas atmosphere for an hour or longer.

17. The semiconductor device as set forth in claim 15, wherein said copper-tin (Cu—Sn) alloy layer has a thickness equal to or greater than 2 micrometers.

18. The semiconductor device as set forth in claim 15, wherein said copper-tin (Cu—Sn) alloy layer has a thickness equal to or greater than 3 micrometers.

19. A semiconductor device comprising:
   (a) a semiconductor chip;
   (b) a wiring making electrical connection with said semiconductor chip and containing copper (Cu) therein; and
   (c) a solder ball making contact with said wiring and containing tin (Sn) therein, said solder ball containing lead (Pb) agglomerates scattering therein at a density of $20 \times 10^4$ mm$^{-3}$ or greater,
   said semiconductor device resulting from the steps of;
      (a) forming said wiring on a substrate;
      (b) mounting said solder ball on said wiring; and
      (c) keeping a product resulting from said step (b), in inactive gas atmosphere or in reducing gas atmosphere at a temperature equal to or greater than a melting point of said solder ball,
         said density of said lead agglomerates scattering in said solder ball being greater than a density of said lead agglomerates in said solder ball if said product resulting from step (b) were kept at a temperature lower than said melting point of said solder ball.

20. A semiconductor device comprising:
   (a) a semiconductor chip;
   (b) a wiring making electrical connection with said semiconductor chip and containing copper (Cu) therein; and
   (c) a solder ball making contact with said wiring and containing tin (Sn) therein, said solder ball containing lead (Pb) agglomerates scattering therein, said lead agglomerates having a cross-sectional area of 10 square micrometers or smaller in average,
   said semiconductor device resulting from the steps of:
      (a) forming said wiring on a substrate;
      (b) mounting said solder ball on said wiring; and
      (c) keeping a product resulting from said step (b), in inactive gas atmosphere or in reducing gas atmosphere at a temperature equal to or greater than a melting point of said solder ball,
         said cross-sectional area of said lead agglomerates being smaller than a cross-sectional area of said lead agglomerates if said product resulting from step (b) were kept at a temperature lower than said melting point of said solder ball.

* * * * *